(12) United States Patent
Levi et al.

(10) Patent No.: US 7,227,217 B2
(45) Date of Patent: Jun. 5, 2007

(54) NONVOLATILE MEMORY CELL HAVING FLOATING GATE, CONTROL GATE AND SEPARATE ERASE GATE, AN ARRAY OF SUCH MEMORY CELLS, AND METHOD OF MANUFACTURING

(75) Inventors: Amitay Levi, Cupertino, CA (US); Pavel Klinger, San Jose, CA (US); Bomy Chen, Cupertino, CA (US); Hieu Van Tran, San Jose, CA (US); Dana Lee, Santa Clara, CA (US); Jack E. Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 151 days.

(21) Appl. No.: 11/078,562

(22) Filed: Feb. 28, 2005

(65) Prior Publication Data
US 2005/0213386 A1 Sep. 29, 2005

Related U.S. Application Data

(62) Division of application No. 10/622,855, filed on Jul. 18, 2003, now abandoned.

(51) Int. Cl.
*H01L 29/788* (2006.01)
*H01L 29/76* (2006.01)
(52) U.S. Cl. ........................ 257/316; 257/315
(58) Field of Classification Search ......... 257/314–324
See application file for complete search history.

(56) References Cited

U.S. PATENT DOCUMENTS

| 5,021,999 | A  | 6/1991  | Kohda et al.   |
|-----------|----|---------|----------------|
| 5,029,130 | A  | 7/1991  | Yeh            |
| 5,739,567 | A  | 4/1998  | Wong           |
| 5,768,192 | A  | 6/1998  | Eitan          |
| 6,002,152 | A  | 12/1999 | Guterman et al.|
| 6,011,725 | A  | 1/2000  | Eitan          |
| 6,093,945 | A  | 7/2000  | Yang           |
| 6,103,573 | A  | 8/2000  | Harari et al.  |
| 6,151,248 | A  | 11/2000 | Harari et al.  |
| 6,281,545 | B1 | 8/2001  | Liang et al.   |
| 6,329,685 | B1 | 12/2001 | Lee            |
| 6,331,721 | B1 | 12/2001 | Sung et al.    |
| 6,420,231 | B1 | 7/2002  | Harari et al.  |

(Continued)

OTHER PUBLICATIONS

IEEE, 2002, entitled "Quantum-well Memory Device (QW/MD) With Extremely Good Charge Retention," Z. Krivokapic, et al. (4 pages).

(Continued)

*Primary Examiner*—Cuong Nguyen
(74) *Attorney, Agent, or Firm*—DLA Piper US LLP

(57) ABSTRACT

A nonvolatile memory cell having a floating gate for the storage of charges thereon has a control gate and a separate erase gate. The cell is programmed by hot channel electron injection and is erased by poly to poly Fowler-Nordheim tunneling. A method for making an array of unidirectional cells in a planar substrate, as well as an array of bidirectional cells in a substrate having a trench, is disclosed. An array of such cells and a method of making such an array is also disclosed.

15 Claims, 11 Drawing Sheets

U.S. PATENT DOCUMENTS

| | | | |
|---|---|---|---|
| 6,426,896 | B1 | 7/2002 | Chen |
| 6,541,815 | B1 | 4/2003 | Mandelman et al. |
| 6,597,036 | B1 | 7/2003 | Lee et al. |
| 6,888,193 | B2* | 5/2005 | Huang ................. 257/317 |
| 6,894,339 | B2* | 5/2005 | Fan et al. ............. 257/314 |
| 6,952,034 | B2* | 10/2005 | Hu et al. .............. 257/315 |
| 7,129,536 | B2* | 10/2006 | Chen et al. ........... 257/316 |
| 2002/0056870 | A1 | 5/2002 | Lee et al. |
| 2002/0163031 | A1 | 11/2002 | Lee et al. |
| 2004/0087084 | A1 | 5/2004 | Hsieh |
| 2005/0037576 | A1* | 2/2005 | Chen et al. ........... 438/259 |
| 2005/0045940 | A1* | 3/2005 | Chen et al. ........... 257/315 |
| 2005/0104116 | A1* | 5/2005 | Chen et al. ........... 257/315 |

OTHER PUBLICATIONS

Hayashi et al, "A Self-Aligned Split-Gate Flash EEPROM Cell With 3-D Pillar Structure," pp. 87-88, 1999 Symposium on VLSI Technology Digest Of Technical Papers, Center For Integrated Systems, Standord University, Stanford, CA 94305, USA.

* cited by examiner

NONVOLATILE MEMORY CELL HAVING FLOATING GATE, CONTROL GATE AND SEPARATE ERASE GATE, AN ARRAY OF SUCH MEMORY CELLS, AND METHOD OF MANUFACTURING

CROSS-REFERENCE TO RELATED APPLICATIONS

This application is a divisional application of U.S. patent application Ser. No. 10/622,855 filed on Jul. 18, 2003, now abandoned the subject matter of which is incorporated herein by reference.

TECHNICAL FIELD

The present invention relates to a nonvolatile floating gate memory cell having a control gate and a separate erase gate, an array of such cells, and a method of manufacturing.

BACKGROUND OF THE INVENTION

Nonvolatile memory cells have a floating gate for the storage of charges thereon to control the conduction of current in a channel in a substrate of a semiconductive material is well known in the art. See, for example, U.S. Pat. No. 5,029,130 whose disclosure is incorporated herein by reference in its entirety. In U.S. Pat. No. 5,029,130, a split gate nonvolatile memory cell having a floating gate with source side injection and poly to poly tunneling is disclosed. The memory cell has a first region and a second region with a channel region therebetween with the channel region having a first portion and a second portion. A floating gate is disposed over a first portion of the channel region is insulated therefrom and controls the conduction of current in the channel region depending upon the charges stored in the floating gate. A word line/erase gate is disposed over a second portion of the channel region and is insulated therefrom and controls the conduction of current in the second portion of the channel region. The cell is programmed when electrons through the mechanism of hot electron channel injection are injected from the channel region onto the floating gate. The cell is erased by electrons from the floating gate tunneling to the erase gate through the mechanism of Fowler-Nordheim tunneling. The floating gate is characterized by having a sharp tip to facilitate the tunneling of electrons from the floating gate to the control gate. In U.S. Pat. No. 5,029,130, the control gate/erase gate performs two functions. First, it controls the conduction of current in the second portion of the channel region during the operations of programming and read. Secondly, it is supplied with a high voltage during the erase operation to attract the electrons from the spaced apart and insulated floating gate. These two functions have compromised the design of a single member which must perform both functions. Specifically, during programming and read, the word line/control gate receives low voltage whereas during erase, it must receive a high voltage.

It is therefore, an object of the present invention to overcome this and other difficulties.

SUMMARY OF THE INVENTION

Accordingly, in the present invention, a nonvolatile memory cell comprises a substrate of substantially single crystalline semiconductive material having a first conductivity type. A first region of a second conductivity type is in the substrate. A second region of the second conductivity type is in the substrate spaced apart from the first region. A channel region is between the first region and second region with the channel region having a first portion and a second portion. A control gate is insulated from the second portion of the channel region. A floating gate is adjacent to the control gate and is insulated therefrom. The floating gate is also insulated from the first portion of the channel region. The floating gate has a tip which is closest to the control gate. An erase gate is insulated from the control gate and the tip of the floating gate. An insulating material is between the tip and the erase gate to permit charges to tunnel from the tip to the erase gate.

The present invention also relates to an array of the foregoing described nonvolatile memory cells. Finally, the present invention relates to a method of manufacturing an array of nonvolatile memory cells.

DETAILED DESCRIPTION OF THE INVENTION

Figure 1A:
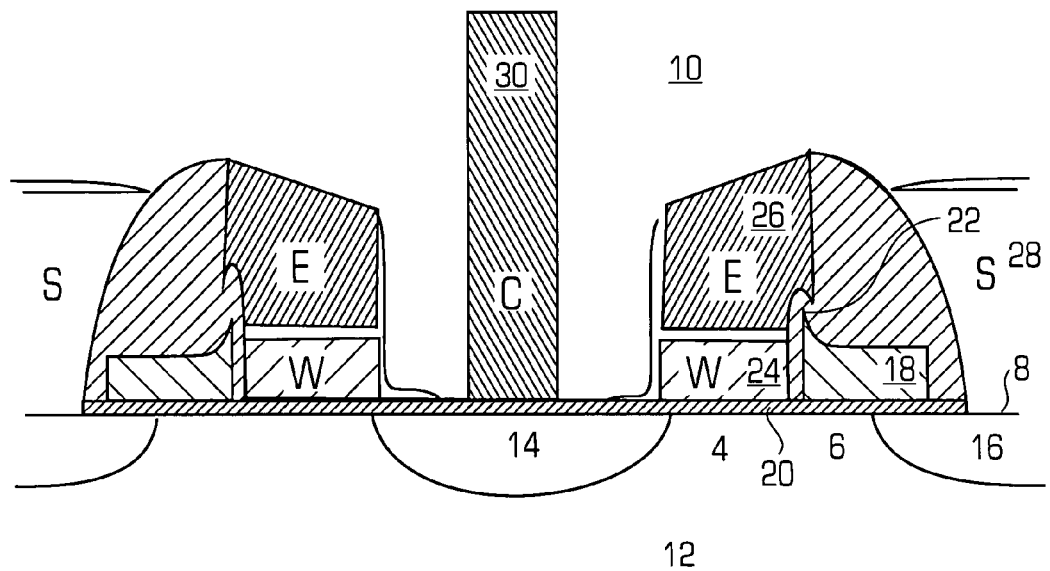
FIG. 1A is a cross-sectional view of a first embodiment of a nonvolatile memory cell of the present invention, in which the nonvolatile memory cell is unidirectional in operation and is formed on a planar surface of a semiconductor substrate.

Referring to FIG. 1A, there is shown a cross-sectional view of a first embodiment of a nonvolatile memory cell 10 of the present invention. Similar to the cell shown and described in U.S. Pat. No. 5,029,130, whose disclosure is incorporated herein in its entirety by reference, the memory cell 10 is formed in a substantially single crystalline semiconductor substrate 12, such as silicon. The substrate 12 is of a first conductivity type. The substrate 12 also has a planar surface 8. Within the substrate 12 is a first region 14 of a second conductivity type. A second region 16 of a second conductivity type is spaced apart from the first region 14. Between the first region 14 and the second region 16 is a channel region. The channel region comprises two portions: a first portion 4 which is adjacent to the first region 14 and a second portion 6 which is adjacent to the second region 16. Spaced apart from the substrate 12 is a floating gate 18 which is on a insulating layer 20. The floating gate 18 is positioned over the second portion 6 of the channel region and is capacitively coupled to the second region 16. The floating gate 18 has a tip 22. A source contact 28 contacts the second region 16 while a drain contact 30 contacts the first region 14. Spaced apart and insulated from the floating gate 18 is a word line 24 or control gate 24. The word line 24/control gate 24 is also on the insulating layer 20 and is spaced apart from the substrate 12. The control gate 24 is positioned over the first portion 4 of the channel region and is closest to the tip 22. Thus far, the structure shown and described is fully disclosed in U.S. Pat. No. 5,029,130.

In the improvement, the nonvolatile memory cell 10 further comprises an erase gate 26. The erase gate is spaced apart and is insulated from the word line 24. In addition, the erase gate 26 is insulated and spaced apart from the tip 22 of the floating gate 20. Between the erase gate 26 and the tip 22 of the floating gate 20 is an insulating material. The insulating material permits Fowler-Nordheim tunneling of electrons from the floating gate 18 to the erase gate 26. Because the erase gate 26 can be separately controlled, the functions of erase and read/program can be separated, thereby creating a greater degree of control over the program and read operations than over the erase operations.

Figure 1B:
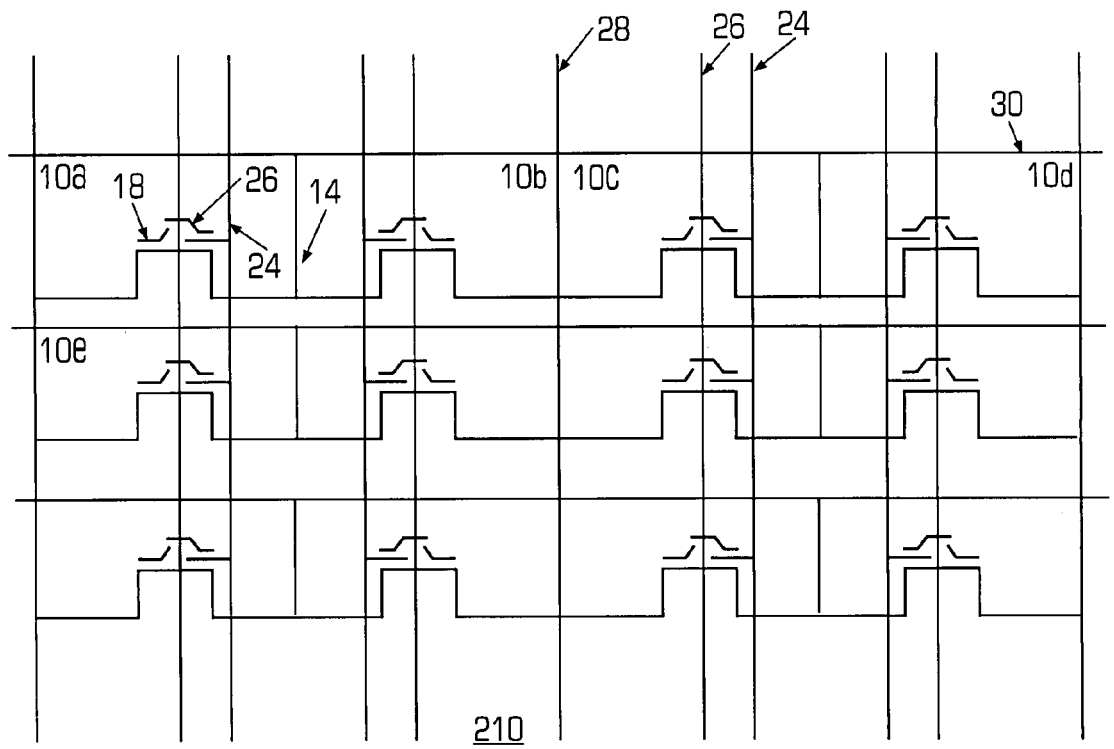
FIG. 1B is a schematic circuit diagram of an array of memory cells of the first embodiment shown in FIG. 1A.

Referring to FIG. 1B, there is shown an array 210 of the memory cells 10 of the present invention. As shown in FIG. 1B, the array 210 comprises a plurality of memory cells 10 arranged in a plurality of rows and columns. As is well known in the art, the cells 10 are arranged such that each pair of immediately adjacent cells are mirror images of one another. Thus, a first region 14 is common to a pair of cells 10A and 10B, whereas a second region 16 is common to a pair of cells 10B and 10C. Cells 10 that are arranged in the same row such as cells 10A, 10B and 10C have their first regions 14 connected in common. Cells 10 that are arranged in the same column, such as cells 10A and 10E, have their erase gates 26 connected in common, and have their second regions 16 connected in common. As is well known to those skilled in the art, the terms rows and columns can be interchanged.

In the operation of the memory array 210, the following voltages are applied.

|  | Erase gate 26 | Control Gate 24 | | First Region 14 | | Second Region 16 |
| --- | --- | --- | --- | --- | --- | --- |
|  |  | Sel | Unused | Sel | Unused |  |
| Erase | +12 v | 0 | 0 | 0 | 0 | 0 |
| Program | 1.4 v | 1.4 v | 0 | .5 v | 1.8 v | +12 v |
| Read | 1.6–2.2 v | 1.6–2.2 v | 0 | .8 v | 0 | 0 |

Figure 2A:
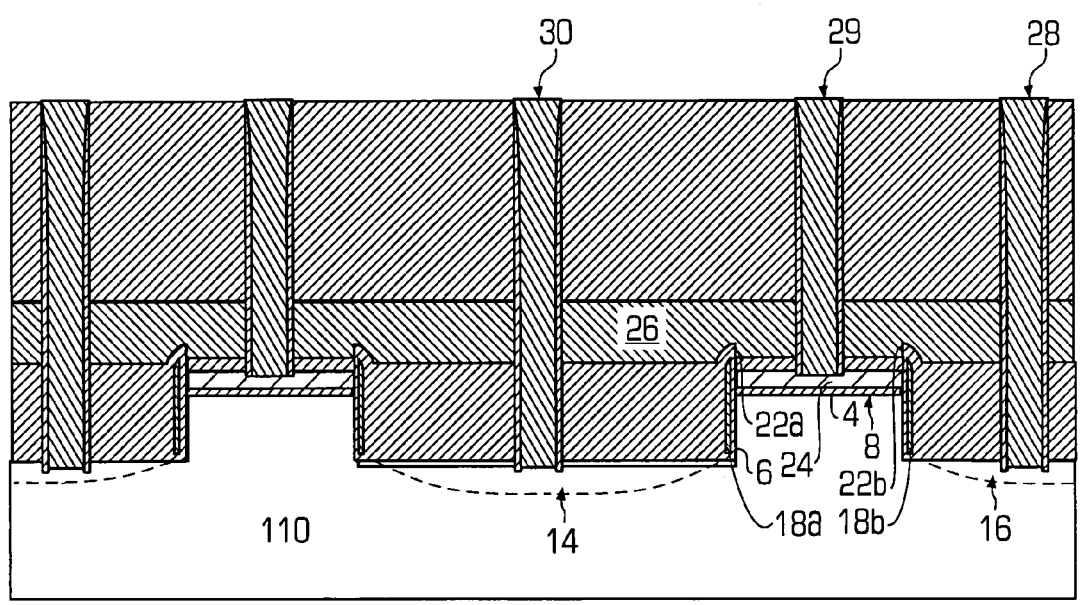
FIG. 2A is a second embodiment of a non-volatile memory cell of the present invention in which the nonvolatile memory cell is bidirectional in operation and formed in a trench and a planar surface portion of a semiconductor substrate.
Figure 2B:
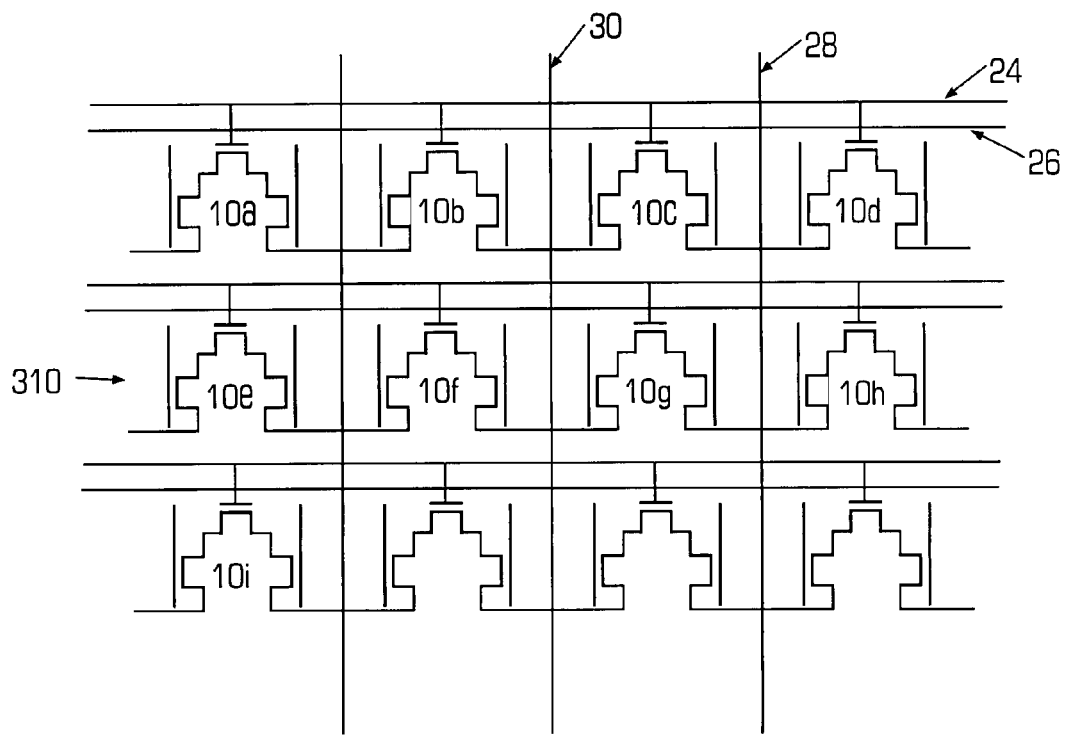
FIG. 2B is a schematic circuit diagram of an array of memory cells of the second embodiment shown in FIG. 2A.
Figure 3A:
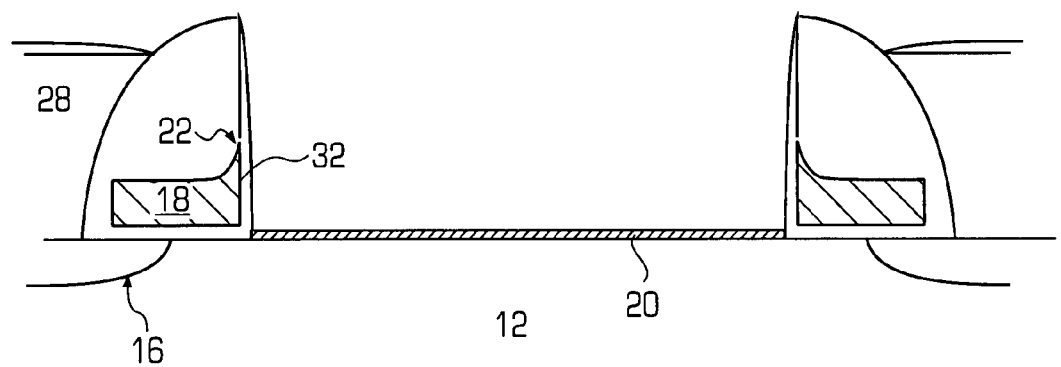
FIGS. 3A–3J are the steps showing a method of manufacturing the nonvolatile memory cell of the first embodiment shown in FIG. 1A and the array shown in FIG. 1B.
Figure 3B:
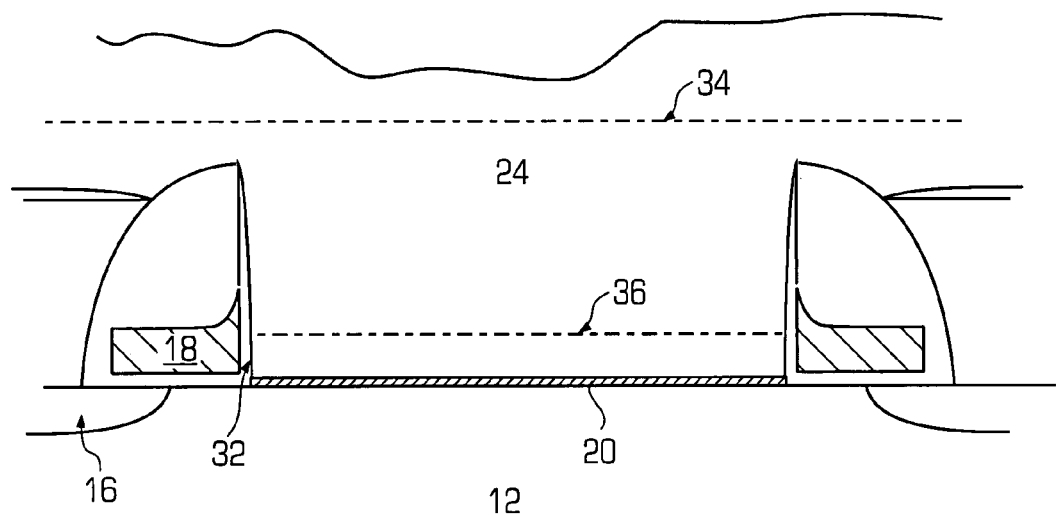

Referring to FIG. 3A, there is shown one step in the manufacturing of the nonvolatile memory cell 10 and array 210 of the present invention. The initial steps for creating the isolation regions are described in U.S. Pat. No. 6,329,685 whose disclosure is incorporated herein by reference in its entirety. In particular, initially, the steps shown in FIGS. 1A-1 through 1C-4 and from 2A-4 through 2F-4 of U.S. Pat. No. 6,329,685 are initially formed. As a result, as shown in FIG. 3A, the second region 16 is formed with source contacts 28 made thereto. In addition, the floating gates 18 are formed, each having a sharp tip 22. Finally, an oxide layer 20 of approximately 30–50 angstrom is deposited. A layer of silicon nitride 32 is formed laterally to the floating gate 18. Although silicon nitride 32 is formed, silicon oxide may also be used.

Polysilicon 24 is then deposited. After the polysilicon 24 is deposited, through CMP or chemical mechanical polishing, it is etched to a level 34. Thereafter, the polysilicon 24 is anisotropically etched to level 36. The end point for the etch stop 36 is reached when on the periphery of the array (not shown) the etch stops on the STI in the periphery. The thickness of the remaining polysilicon 24 should be approximately 500 angstroms. The STI level in the periphery should be approximately 500 angstroms above silicon surface to serve as the end point. The STI level in the cell array area should be flat with the silicon surface. From the structure shown in FIG. 3B, the silicon nitride 32 is removed by isotropic dry etch. However, silicon nitride 32 remains between the polysilicon 24 and the floating gate 18. The resultant structure is shown in FIG. 3C.

Figure 3C:
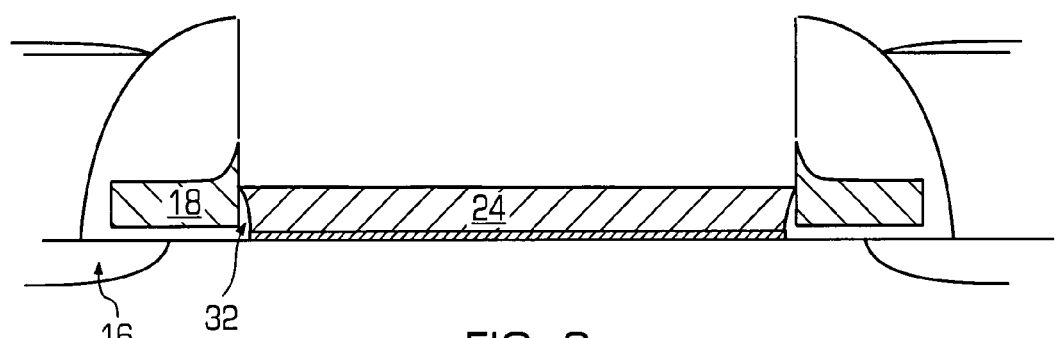

The structure in FIG. 3C is then subjected to CMP and etch back with a final thickness of the word line 24 being approximately 500 angstroms. The resultant structure is shown in FIG. 3D.

Figure 3D:
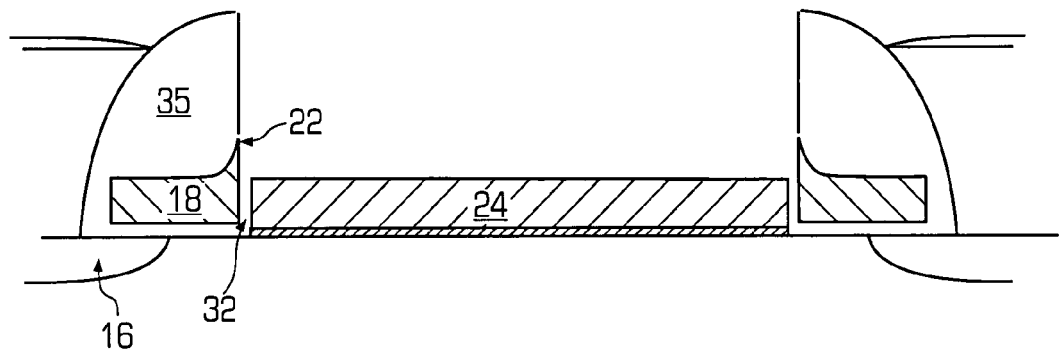
Figure 3E:
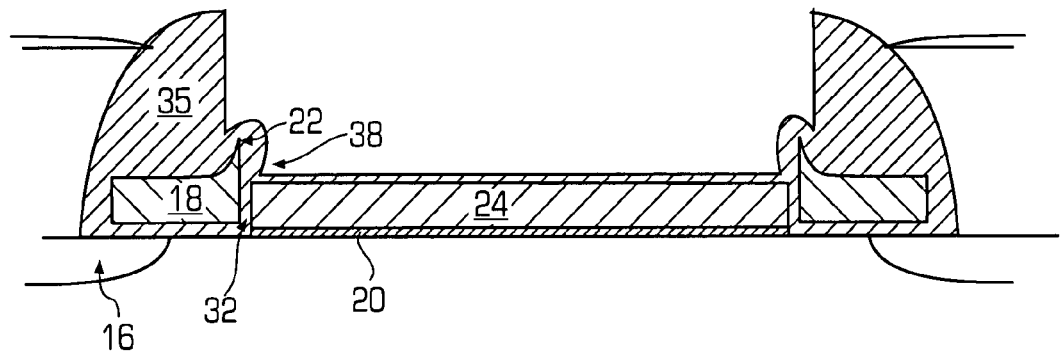

The structure shown in FIG. 3D is then dipped in hydrofluoric acid to remove a portion of the oxide spacer 36 to expose the tip 22. The structure is then subject to an IPO (interpoly oxide) deposition forming a tunnel oxide layer 38 on the polysilicon 24 and covering the tip 22. Alternatively, the hydrofluoric acid dip occurs immediately prior to the deposition of layer 32. A tunneling dielectric 38 is formed by a combination of thermal oxidation and CVD deposition. This dielectric 38 will eventually insulate the erase gate 26 from the floating gate 18 and the word line 24. The resultant structure is shown in FIG. 3E.

Figure 3F:
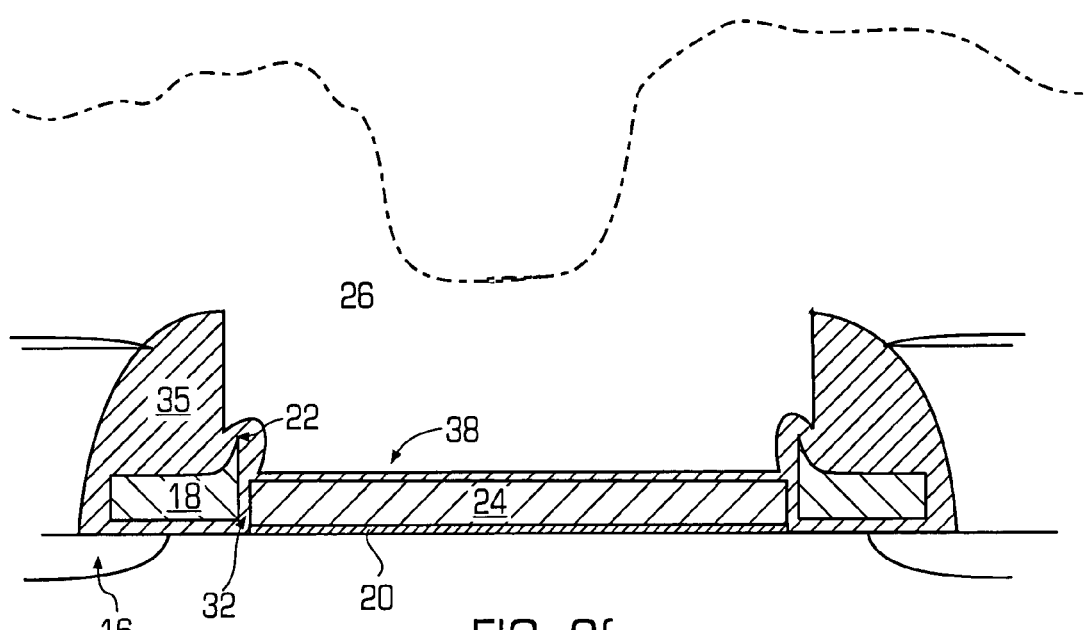

Thereafter, polysilicon 26 is deposited everywhere in a conformal deposition. This polysilicon 26 will eventually form the erase gate. The polysilicon 26 deposited includes a region over the tunnel oxide 38 and over the word line 24 but is insulated therefrom. The resultant structure is shown in FIG. 3F.

Figure 3G:
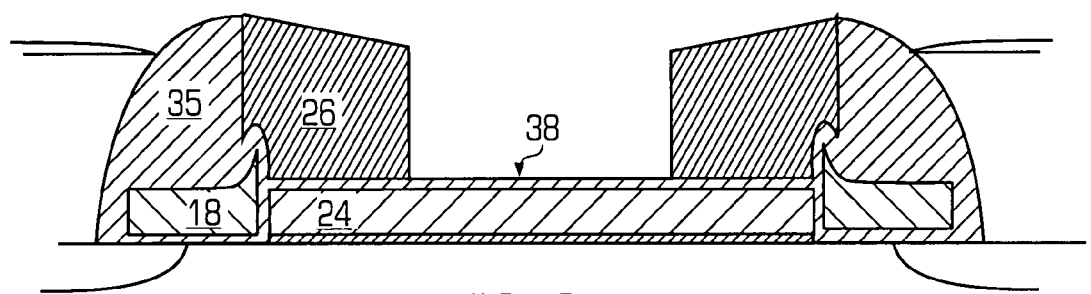

The polysilicon 26 is etched with an anisotropic etch. As is well known, the combination of conformal deposition followed by anisotropic etch results in a well defined spacer at the vertical edges 36. The polysilicon layer 26 is etched until the interpolyoxide layer 38 is reached. The resultant structure is shown in FIG. 3G.

Figure 3H:
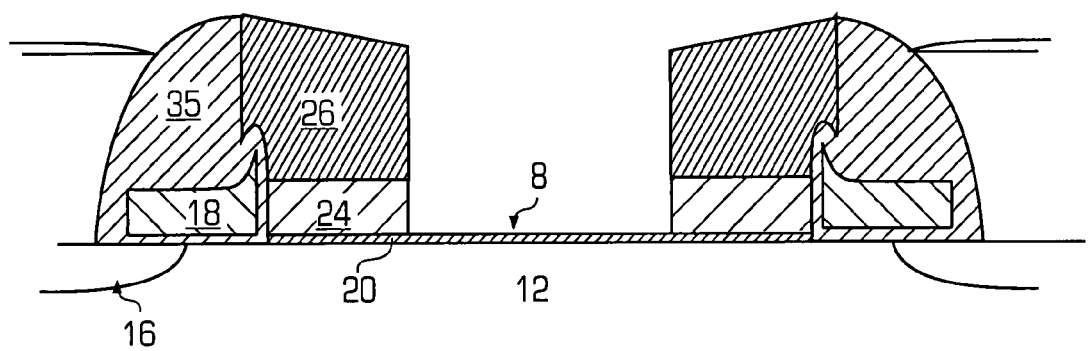

Using the erase gate 26 as a mask, the interpoly oxide 38 is then etched and the word line or control gate 24 poly is then etched and the word line oxide layer 20 is etched until the planar surface 8 of the substrate 12 is reached. The resultant structure is shown in FIG. 3H.

Figure 3I:
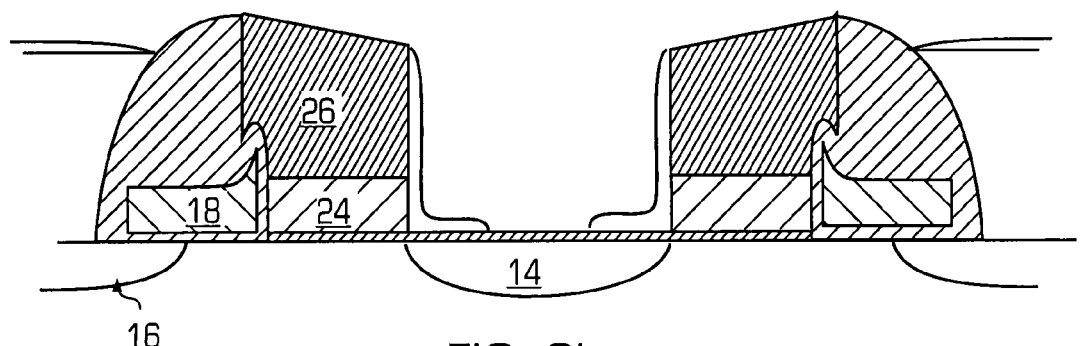

Appropriate implantation and spacers are made using the edges of the erase agtes 26 and the word line gates 24 to form the LDD structure for the first region 14. The resultant structure is shown in FIG. 3I.

Figure 3J:
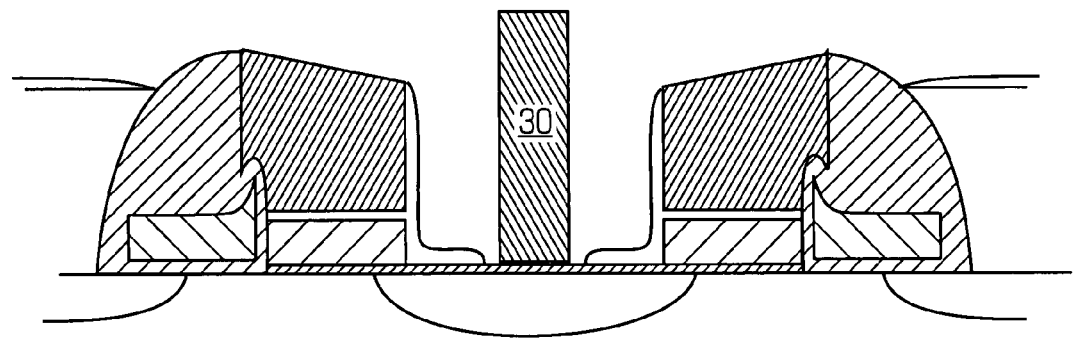

Contact formation 30 is then made to the first region 14. The resultant structure is shown in FIG. 3J.

Figure 3K:
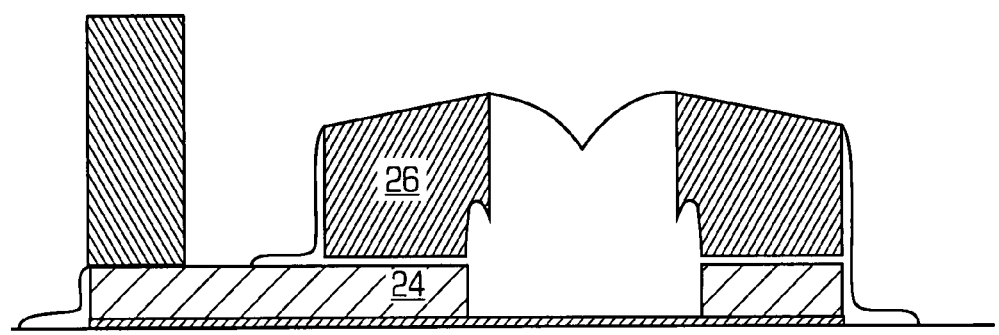
FIG. 3K is a cross-sectional view taken along the line 3k—3k in FIG. 4.
Figure 4:
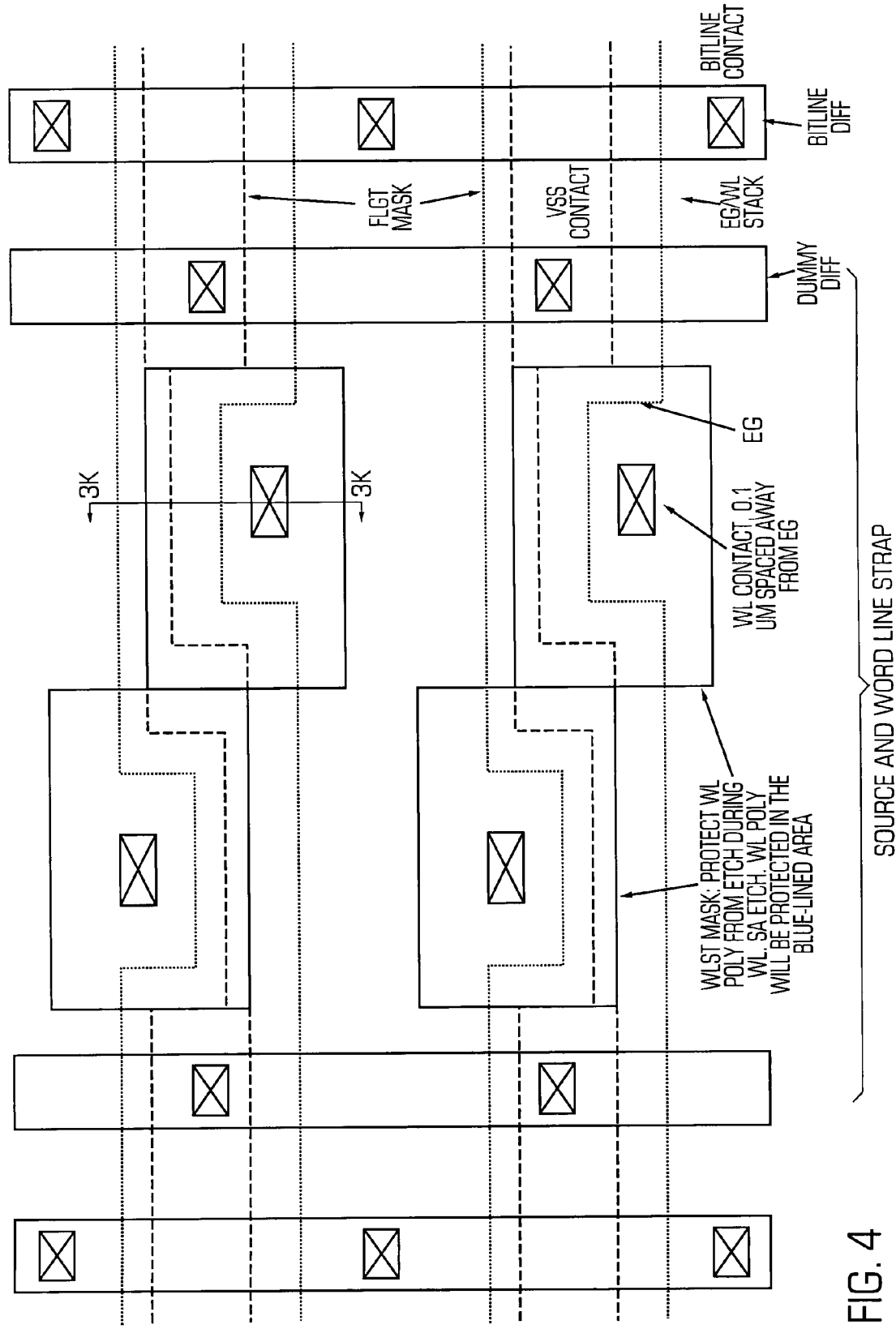
FIG. 4 is a top view of an array of nonvolatile memory cells of the first embodiment shown in FIG. 1A in which cells are offset to accommodate strapping lines.

As can be seen from FIG. 1B, the erase gate 26 and the word line gate 24 in the same row are connected in the same direction. Thus, since the erase gate 26 is "over" the word line gate 24, there is difficulty in accessing the word gate 24 for strapping. Accordingly, periodically, in a preferred embodiment this is 128 cells, the word line gate 24 is extended in a direction such that strapping can occur. A top planar view of the array 210 is shown in FIG. 4. As can be seen, where the cross-sectional line 3K—3K is shown, the erase gate 26 is "indented" permitting the word line 24 to be laterally extended to be connected to a strap. A cross-sectional view taken along the line 3K—3K is shown in FIG. 3K showing the strapping to the word line 24.

Referring to FIG. 2A, there is shown a second embodiment of a nonvolatile memory cell 110 of the present invention. The cell 110 is similar to the cell 10 shown in FIG.

1A, with the exception that each cell 110 has two floating gates and operates bidirectionally. In addition, the cell 110 has a control gate 24 and a separate erase gate 26 for each cell 110. More specifically, each cell 110 has a first region 14 and a second region 16 spaced apart from one another with a channel region therebetween, in a substrate 12. Each of the first region 14 and a second region 16, however, lies in a trench in the substrate 12 with a portion of the channel region being a planar surface 8. Each of the trenches has a bottom and a side wall with the first region 14 and the second region 16 being at the bottom of the trench. A first floating gate 18A and a second floating gate 18B are along the side of the sidewalls, spaced apart therefrom and insulated therefrom. Thus, each of the floating gate 18A and 18B controls the conduction of the channel region which is along the sidewall of the trench. The channel region of the cell 110 is similar to the channel region of the cell 10 in that it has a first portion 4 and a second portion 6. The floating gate controls the second portion 6 of the channel which is along the sidewall of the trench. A control gate 24 is substantially parallel to the planar surface 8 and controls the first portion 4 of the channel region which is along the planar surface 8. A first contact 30 contacts the first region 14 and a second contact 28 contacts the second region 16. Thus, each of the contacts 30 and 28 extend into the trench. A contact 29 electrically connects to the control gate 24. Each of the floating gates 18A and 18B has a tip 22A and 22B respectively which are pointed away from the bottom of the trenches where the first region 14 and 16 lie. Thus, the tips 22A and 22B are adjacent to but spaced apart from the control gate 24. An erase gate 26 is substantially above the control gate 24 and is positioned to intercept electrons or charges emitted from the floating gate 18A and 18B. The erase gate 26 is insulated and separate from the control gate 24.

The operation of the cell 110 is as follows.

To program, the first region 14 is held at a small positive voltage such as 0.1 volts, the word line 24 is at a voltage sufficient to turn on the second portion 4 of the channel region, and the second region 16 is held at a programming voltage such as +6 volts. The erase gate 26 is held at a moderate positive voltage such as +3.0V. The voltages on the erase gate 26 and word lines 24 capacitively couple voltage on the first floating gate 18A. That voltage together with the initial charge state of the floating gate 18A are sufficient to invert the second portion 6 of the channel. With the second portion 6 of the channel region being turned on, and the first portion 4 being turned on, electrons are accelerated as they traverse to the second region 16 and are injected onto the second floating gate 18B through the mechanism of hot channel electron injection similar to the operation described for the cell 10 shown in FIG. 1A. To program the first floating gate 18A, the voltages on the first region 14 and the second region 16 are reversed.

To erase both the first floating gate 18A and the second floating gate 18B, the first region 14 and the second region 16 are held at ground. The erase gate 26 is held at a high potential such as +12 volts. The control gate 24 is held at floating. In such a case, the electrons stored on the floating gate 18A and 18B are attracted by the high positive potential on the erase gate 26 and through the mechanism of Fowler-Nordheim tunneling, they tunnel through the interpoly oxide to the erase gate 26.

To read the cell 110 and to determine if the floating gate 18B is programmed, the second region 16 is held to ground. The word line 24 is held at +2 volts sufficient to turn on the first portion 4 of the channel region. A positive potential such as +3 volts is applied to the first region 14. With the first region 14 at +3 volts and the contact 30 at +3 volts, even if the first floating gate 18A were charged, the depletion region would extend to the first portion 4 of the channel region. Conduction of the electrons in the channel region between the first region 14 and the second region 16 would then depend upon the state of the floating gate 18B. If floating gate 18B were erased, then the channel region adjacent to the second floating gate 18B would conduct and a read current would pass from the first region 14 to the second region 16. If the second floating gate 18B were programmed, then the negatively charged electrons on the second floating gate 18B would prevent a read current from passing between the first region 14 and the second region 16. To read the cell 110 to determine whether the first floating gate 18A is programmed, the voltages applied to the first region 14 and the second region 16 are reversed. During read, a moderate voltage, +3.0V may be applied to the erase gate 26 to capacitively couple voltage to the floating gates 18A and 18B. This shifts the voltage operating window as may be convenient for circuit operation.

From the foregoing, it is seen that the operation of the cell 110 is similar to the operation of cell 10, except cell 110 operates bidirectionally.

A schematic view of an array 310 employing the cells 110 of the present invention is shown in FIG. 2B. As shown in FIG. 2B, the array 310 comprises a plurality of cells 110 arranged in a plurality of rows and columns. Again, the term "row" and "column" are interchangeable. For the cells 110 that are in the same row such as cells 110A, 110B and 110C, the erase gate 26 is connected together. In addition, the control gate 24 connects cells 110 that are in the same row. For cells that are in the same column, i.e. cells 110A, 110E and 110I, the contact line 30 connects the first regions 14 together. In addition, the contact line 28 connects the second region 16 together.

Consistent with the foregoing, the voltages applied to the various selected and unselected cells and portions thereof for the operations of program, erase and read are as follows:

| | Erase gate 26 | Control Gate 24 | | First Region 14 | | Second Region 16 | |
|---|---|---|---|---|---|---|---|
| | | Sel | Unused | Sel | Unused | Sel | Unused |
| Erase | +12 v | 0 | 0 | 0 | 0 | 0 | 0 |
| Program gate 18a | 3–5 v | $V_t$ | 0 | +6 v | 0 | 0~0.5 | 0 |
| Program gate 18b | 3–5 v | $V_t$ | 0 | 0~0.5 | 0 | +6 v | 0 |
| Read gate 18a | 3–5 v | 2~4 v | 0 | 0 | 0 | 2~3 v | 0 |
| Read gate 18b | 3–5 v | 2~4 v | 0 | 2~3 v | 0 | 0 | 0 |

Figure 5A:
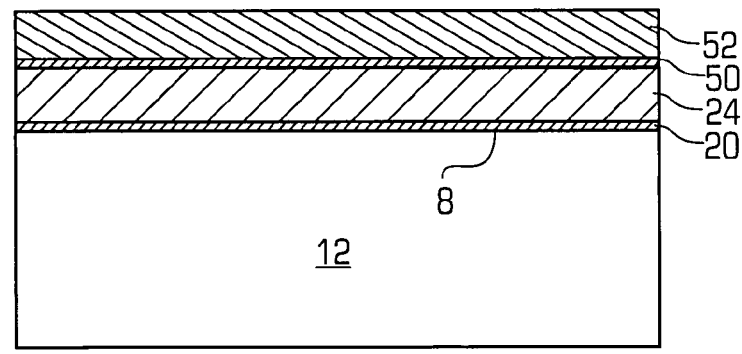
FIGS. 5A–5K are cross-sectional views showing the process of making the nonvolatile memory cells of the second embodiment shown in FIG. 2A, and the array shown in FIG. 2B.

A method of manufacturing the cell 110 and the array 310 is as follows. Referring to FIG. 5A there is shown a cross-sectional view of the first step in the process of making the cell 110 and the array 310. The layers of materials that are on the substrate 12 (having a first conductivity, typically P type) consist of an oxide layer 20 of approximately 20–50 angstroms, a polysilicon layer 24 of approximately 500–1000 angstroms (which may also be polysilicide), and an oxide layer 50 of approximately 500–1000 angstroms on the polysilicon 24. Finally, a layer 52 of 200–400 angstroms of silicon nitride is on the second layer of oxide 50.

Figure 5B:
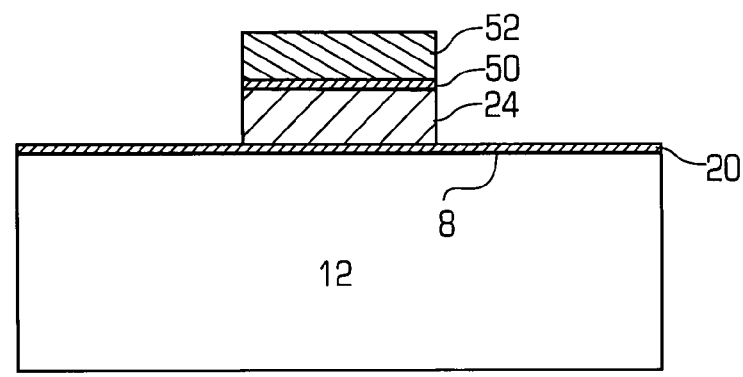

The structure shown in FIG. 5A is then subject to a masking operation in which portions of the structure are masked and the unmasked portions are etched. The etching occurs through the silicon nitride layer 52, the second layer of oxide 50, and the polysilicon 24. The resultant structure is shown in FIG. 5B.

The photo resist (not shown) is then stripped from the region above the silicon nitride 52. Using the silicon nitride 52, the second oxide 50 and the polysilicon 24 as a mask, the first oxide region 20 is then etched and the underlying silicon substrate 12 is also etched to form trenches that are approximately 300–500 angstroms. The resultant structure is shown in FIG. 5C.

Figure 5C:
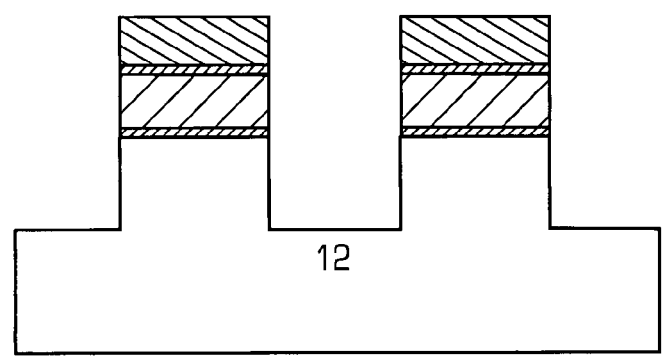

The structure shown in FIG. 5C is then subject to a shallow N+ diffusion implant forming the first region 14 and the second region 16. The resultant structure is shown in FIG. 6D. Although the first and second regions 14 and 16 are shown as being implanted into the substrate 12, they can also be implanted into a well within a substrate 12. The implant can occur with Arsenic ions at $1 \times 10^{15}/cm^2$ dosage at 20 keV. Thus, each of the first region 14 and the second region 16 forms a continuous buried diffusion line. The resultant structure is shown in FIG. 5D.

Figure 5D:
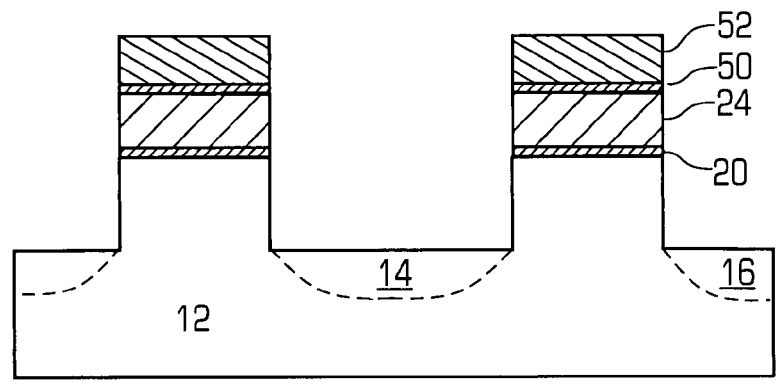
Figure 5E:
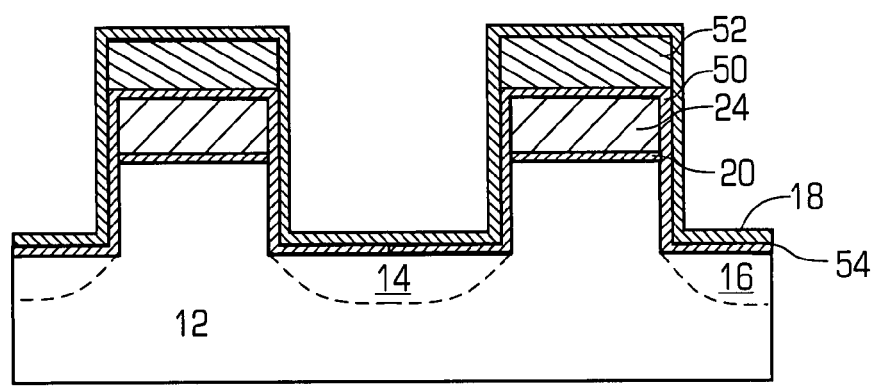

A layer of oxide 54 is then conformally deposited onto the structure shown in FIG. 5D. This would cover the substrate 12 as well as the "side" of the polysilicon 24. Alternatively, the "exposed" polysilicon 24 and silicon substrate 12 can be oxidized in situ to form silicon dioxide. A second layer of polysilicon 18 is then conformally deposited on the layer 54 of oxide. The resultant structure is shown in FIG. 5E.

The polysilicon 18 is then anisotropically etched stopping at the oxide layer 54 forming the resultant first floating gate 18A and the second floating gate 18B. Each floating gate 18 has a tip 22. The oxide layer 54 serves to insulate the floating gate 18A and 18B from the control gate 24. The resultant structure is shown in FIG. 5F.

Figure 5F:
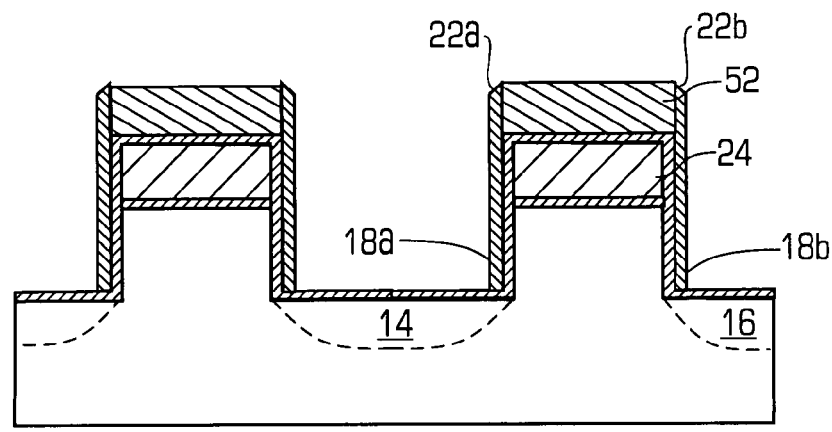
Figure 5G:
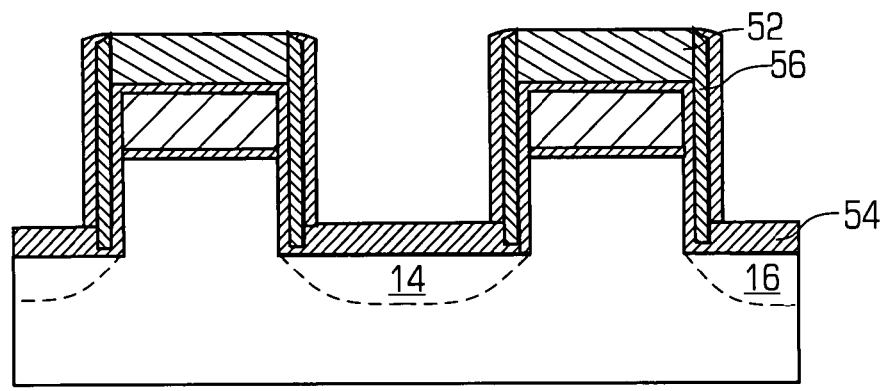

The structure shown in FIG. 5F is then subject to a high temperature oxide deposition step in which a layer 56 of high temperature deposit oxide is conformally deposited on the structure shown in FIG. 5F. The structure is then subject to a CMP step stopping on the silicon nitride layer 52. The resultant structure is shown in FIG. 5G.

A masking step using photoresist is then applied. Photoresist is applied across the surface of the structure shown in FIG. 5G. A mask is applied exposing strips of photoresist that lie above and below the plane of the paper of FIG. 5G. The strips of photoresist (either exposed or unexposed) are removed. The exposed nitride 52, oxide 54 are anisotropically removed. The exposed polysilicon 24 and polysilicon 18 are then removed thereby cutting their continuity. This forms rows of insulation, i.e., rows in which there is no polysilicon 24 and polysilicon 18, although the diffusion regions 14/16 continue to pass through the insulation row.

Middle Of Line oxide layer (MOL) 58, such as BPSG, is then deposited everywhere to a depth of approximately 500–1000 angstroms. The resulting structure is shown in FIG. 5H.

Figure 5H:
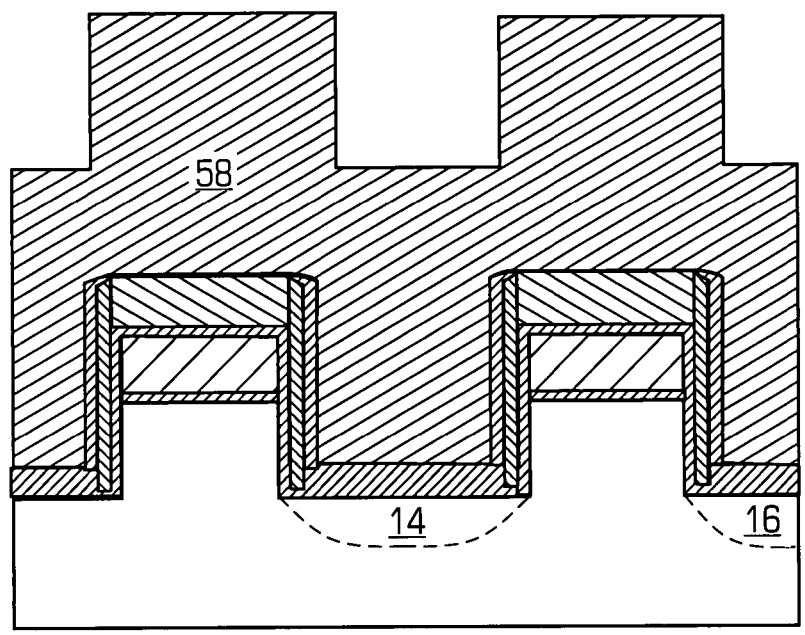
Figure 5I:
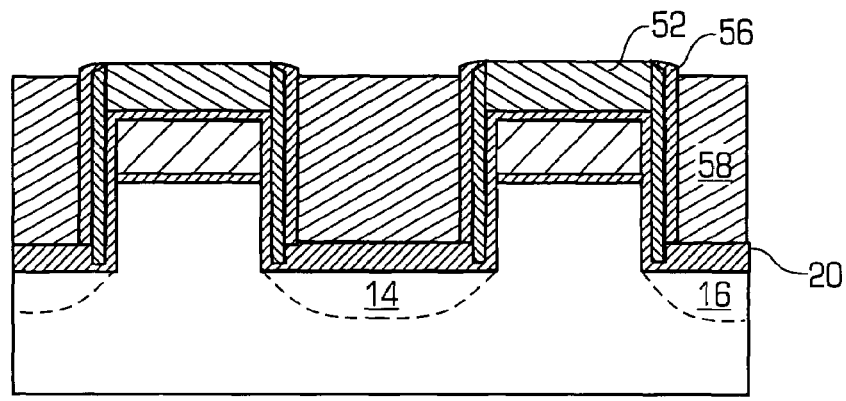

CMP is then applied to the structure shown in FIG. 5H with the silicon nitride layer 52 used as the polished stop. The resultant structure is shown in FIG. 5I.

Figure 5J:
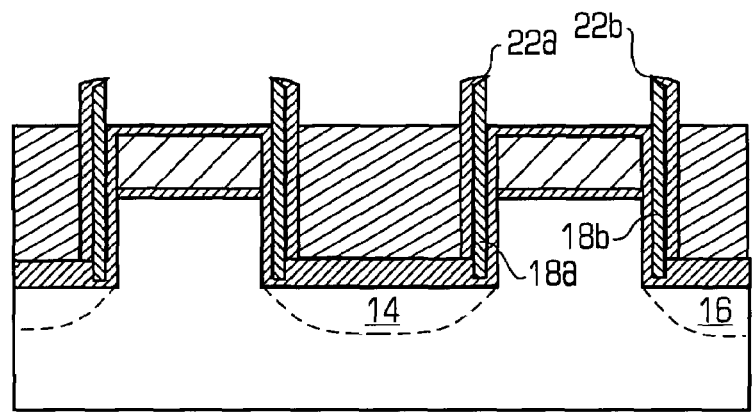

The silicon nitride 52 is then removed by wet etch or dry etch. Further, a short amount of an oxide wet etch is employed on the structure to further expose the tip 22A and 22B of the first and second floating gates 18A and 18B, respectively. The resultant structure is shown in FIG. 5J.

Figure 5K:
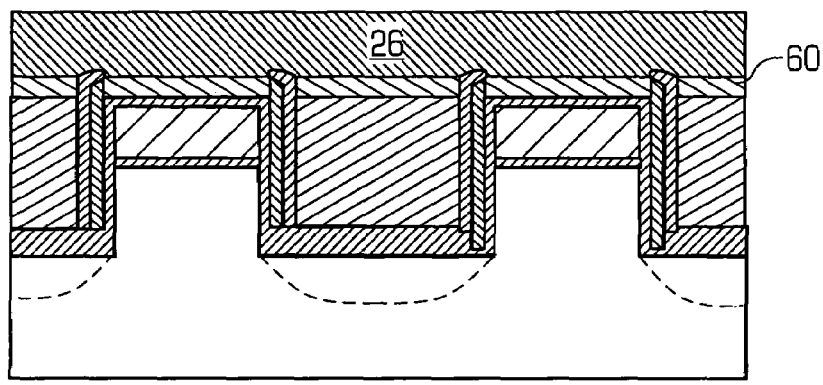

A layer 60 of high temperature oxide is then deposited everywhere covering the tips 22A and 22B. The high temperature oxide is deposited to a depth of approximately 120–200 angstroms. Thereafter, polysilicon 26 to form the erase gate is deposited on the tunneling oxide 60. The resultant structure is shown in FIG. 5K. The polysilicon 26 is a continuous sheet covering over many rows of cells, since the polysilicon 26 is the erase gate and a sector of cells can be erased at a time in a flash device.

Contacts are then formed to the structure shown in FIG. 5K forming the cross-section view shown in FIG. 2A. As is apparent, although three contacts per cell are formed, adjacent cells share the same either first region contact 30 or the second contact region 28. The contacts 30 and 28 contact the buried diffusion 14 and 16, respectively, through the polysilicon 26. Thus, they are used for strapping purpose and need not be applied to every row of cells. The metal lines (not shown) to which the contacts 30 and 28 are attached would run in a direction perpendicular to the paper as shown in FIG. 2B. The contact 29 is also made through the polysilicon 26 and the polysilicon 24. They are made to each cell. The metal line (not shown) to which the contacts 29 are attached would run in a direction parallel to the row direction, as shown in FIG. 2B. Because all the contacts 28, 29 and 30 are made through the polysilicon 26, the polysilicon 26 is fairly "holey." The structural integrity and electrically continuity of the polysilicon 26 is maintained by the polysilicon 26 being continuous over the adjacent insulation rows.

What is claimed is:

1. A bi-directional non-volatile memory cell comprising:
   a substrate of a substantially single crystalline semiconductive material having a first conductivity type, said substrate having a substantially planar surface with a first trench and a second trench in said surface, spaced apart from one another; with each trench having a bottom wall and a side wall;
   a first region of a second conductivity type along said bottom wall of said first trench;
   a second region of said second conductivity type along said bottom wall of said second trench;
   a channel region between said first region and said second region, said channel region having a first portion, a second portion, and a third portion, with said first portion along said sidewall of said first trench, a second portion along said surface of said substrate between said first and second trenches, and said third portion along said sidewall of said second trench;
   a control gate insulated from said second portion of said channel region;
   a first floating gate adjacent to said control gate and insulated therefrom, and insulated from said first portion of said channel region, said first floating gate having a tip;
   a second floating gate adjacent to said control gate and insulated therefrom, and insulated from said third portion of said channel region, said second floating gate having a tip;
   an erase gate insulated from said control gate and said tips of said first and second floating gates; and
   an insulating material between said tips of said first floating gate and said second floating gate and said erase gate permitting charges to tunnel from said tips to said erase gate.

2. The cell of claim 1 wherein said erase gate is substantially parallel to the planar surface.

3. The cell of claim 2 wherein said erase gate extends substantially from said first wench to said second trench.

4. The cell of claim 1 wherein each of said first and second floating gates is insulated from said substrate by a layer of silicon dioxide.

5. The cell of claim 2 wherein each of said first and second floating gates is insulated from said control gate by a layer of silicon nitride.

6. The cell of claim 3 wherein said control gate is insulated from said planar surface by a layer of silicon dioxide.

7. An array of non-volatile memory cells comprising:
   a substrate of a substantially single crystalline semiconductive material having a first conductivity type, said substrate having a substantially planar surface;
   a plurality of non-volatile memory cells arranged in a plurality of columns and rows in said substrate, each of said non-volatile memory cells comprising:
   a first trench and a second trench in said surface, spaced apart from one another; with each wench having a bottom wall and a side wall;
   a first region of a second conductivity type along said bottom wall of said first trench;
   a second region of said second conductivity type along said bottom wall of said second trench;
   a channel region between said first region and said second region, said channel region having a first portion, a second portion, and a third portion, with said first portion along said sidewall of said first trench, a second portion along said surface of said substrate between said first and second trenches, and said third portion along said sidewall of said second trench;
   a control gate insulated from said second portion of said channel region;
   a first floating gate adjacent to said control gate and insulated therefrom, and insulated from said first portion of said channel region, said first floating gate having a tip;
   a second floating gate adjacent to said control gate and insulated therefrom, and insulated from said third portion of said channel region, said second floating gate having a tip;
   an erase gate insulated from said control gate and said tips of said first and second floating gates; and
   an insulating material between said tips of said first floating gate and said second floating gate and said erase gate permitting charges to tunnel from said tips to said erase gate,
   wherein a cell in a column share a common first trench with a cell immediately adjacent thereto on one side; and said cell in said column share a common second trench with a cell immediately adjacent thereto on a side opposite said one side;
   wherein cells in the same row have their first regions connected together; and
   wherein cells in the same column have their control gates connected together.

8. The array of claim 7 wherein said substrate is single crystalline silicon.

9. The array of claim 7 wherein the cells in the same row have their second regions connected together.

10. The array of claim 9 wherein cells in the same column have their erase gate connected together.

11. The array of claim 10 wherein said erase gate is substantially parallel to the planar surface.

12. The array of claim 11 wherein said erase gate extends over a plurality of columns.

13. The array of claim 7 wherein each of said first and second floating gates is insulated from said substrate by a layer of silicon dioxide.

14. The array of claim 13 wherein each of said first and second floating gates is insulated from said control gate by a layer of silicon nitride.

15. The array of claim 14 wherein said control gate is insulated from said planar surface by a layer of silicon dioxide.

* * * * *